United States Patent [19]

Stevenson et al.

[11] 4,380,829

[45] Apr. 19, 1983

[54] SIMPLIFIED DOUBLE BALANCED FREQUENCY CONVERTER

[75] Inventors: David M. Stevenson, Topsfield, Mass.; Gale L. Flanders, Dover-Foxcroft, Me.

[73] Assignee: Varian Associates, Inc., Palo Alto, Calif.

[21] Appl. No.: 264,499

[22] Filed: May 18, 1981

[51] Int. Cl.³ .......................... H04B 1/26; H03H 7/42
[52] U.S. Cl. ...................................... 455/327; 333/26; 455/330
[58] Field of Search ...................... 455/323, 325–328, 455/330, 331; 333/25, 26

[56] References Cited

U.S. PATENT DOCUMENTS 4,063,176 12/1977 Milligan et al. ...................... 455/331
4,125,810 11/1978 Pavio .................................... 455/327
4,293,956 10/1981 Altstatt ................................ 455/327

Primary Examiner—Marc E. Bookbinder
Attorney, Agent, or Firm—Stanley Z. Cole; Peter J. Sgarbossa

[57] ABSTRACT

A simplified, compact, flat microwave frequency converter assembly utilizes a flat quad diode bridge, and has two pairs of opposed flat conductors, each with a respective one of the opposed conductors on a respective side of a flat dielectric substrate. Each of the pair extends orthogonally from their intersection at the bridge. The bridge is connected at opposite corners thereof to adjacent ends of the conductors at the intersection on a first side of the substrate. These first-side conductors are in electrical continuity with a conductive layer extending about the periphery of the substrate on the first side thereof. This layer is, in turn, in contact with a conductive carrier plate by means of which the layer is grounded. On the second side of the substrate, each of the pair of capacitors affixed to the substrate is connected between respective opposite corners of the bridge, and the adjacent ends of the conductors of one of said pairs. In this manner, two pairs of input baluns are provided to accept, for example, an input RF signal, and a local oscillator signal. An output conductor pair is provided, each extending outwardly on the substrate first face from one of the bridge opposite corners to terminals between the bridge and conductive layer, each then continuing on the second face from the terminals to a junction adjacent the substrate edge, and serving as an output from which a heterodyned signal may be obtained.

17 Claims, 3 Drawing Figures

SIMPLIFIED DOUBLE BALANCED FREQUENCY CONVERTER

FIELD OF INVENTION

This invention relates to radio frequency converters or mixers for a doubly balanced conversion; and in particular, to a novel physical and electrical arrangement for microwave converters.

PRIOR ART

The frequency converter or mixer art is a well-established one, and numerous prior designs may be found; see, for example, U.S. Pat. No. 4,186,352 to Halford; 4,063,176 to Milligan; and 4,032,850 to Hill. The first reference is one involving a fair degree of complexity, with an eight-diode double bridge, rather than a four-diode bridge, as is more typical. But it is illustrative of double balanced converters and baluns, and of prior attempts to obtain higher frequency broad band response. In the Hill reference, a double balanced mixer is disclosed which comprises coaxial lines, baluns, and other connectors for input and output purposes which are not susceptible of a totally flat configuration, nor of inherently straightforward electrical connection or layout. Accordingly, this design, although compact and highly effective by present standards, also exhibits disadvantages inherent to the use of such coaxial lines. Similarly, the Milligan reference is an attempt to simplify the design beyond previous references, but it, too, results in additional complexities, notably the rather complex conductive layouts and apertures therein, and in the non-standard wiring of the diodes, requiring a geometrically upstanding physical layout. Specifically, the diode bridge is not wired in the conventional manner of the well-known standard diode quad, in which the four diodes are wired in series in a flat square or rectangular pattern. Instead, each end of each diode is wired to a conductor on the main body of the device, while the other ends are gathered into a single junction. All four diodes are vertically upstanding from the predominant plane of the device, limiting the compactness and thinness obtainable with this design, and resulting in an output junction extending out of the predominant plane of the device, with the attendant additional difficulty of making a connection thereto.

SUMMARY OF THE INVENTION

Accordingly, an object of this invention is to provide a frequency converter of improved compactness, thinness, and simplicity of electrical and physical configuration;

It is another object of the invention to provide a frequency converter assembly having baluns of improved simplicity, compactness, and ease of fabrication;

It is a further object of the invention to provide a frequency converter assembly having nearly all electrical connections as strips carried flat on a single substrate, and utilizing a conventional diode quad bridge and capacitors positioned flat against said substrate.

These objects are achieved by an improvement in a microwave frequency converter having a diode bridge, a first and second pair of input baluns each pair of which has its proximal ends connected to opposite corners of the diode bridge, and with distal ends of the pairs adapted respectively to receive a radio frequency input signal, and a local oscillator input signal. The improvement includes a dielectric substrate mounting the bridge on a first side of the substrate; a first pair of opposed flat conductors on each side of the substrate and extending from first opposite corners of the bridge; and a second pair of opposed flat conductors on each side of the substrate and extending from second opposite corners of the bridge. The conductors of each pair on the second side of the substrate are electrically continuous but isolated from the other pair. The improvement also includes a conducting layer on the first side of the substrate positioned outwardly of the bridge and electrically continuous with ones of the conductors on the first side; and output conductive path means extending outwardly from the bridge along the substrate, and beginning on the first face, passing through the substrate inwardly of the conducting layer, and continuing on the second face, for supplying therefrom a heterodyned output signal.

DETAILED DESCRIPTION OF THE PREFERRED EMBODIMENT

Figure 1:
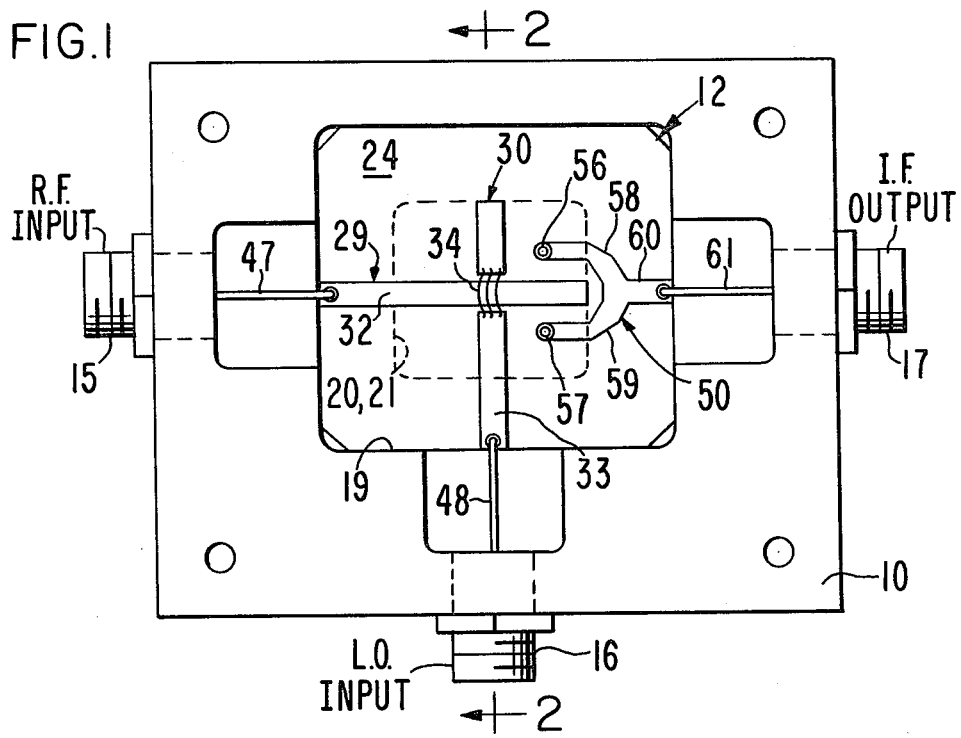
FIG. 1 is a plan view of a complete frequency converter of the present invention, showing some of the constructional and assembly details, and the layout of electrical conductors and components on one side of the device.
Figure 2:
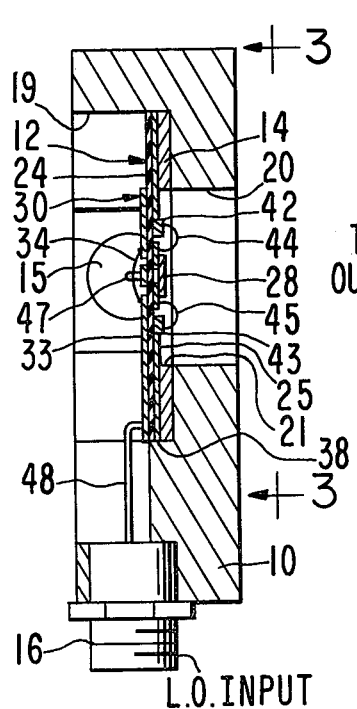
FIG. 2 is a cross-sectional elevational view taken along lines 2—2 of FIG. 1, of the frequency converter of FIG. 1, showing further constructional and electrical details.

Turning now to the Figures, particularly FIGS. 1 and 2, some of the major physical components associated with the converter may be seen. They include a metallic chassis 10 housing the device, an insulating substrate or board 12 of a dielectric material, an apertured metallic carrier plate 14 for conveniently adding rigidity and support to board 12, and coaxial input terminals 15, 16 and 17. Terminal 15 is adapted to receive a radio frequency input signal, terminal 16, a local oscillator input signal, while an output signal from the device is supplied at terminal 17. Chassis 10 includes a generally rectangular recess 19 within its upper surface, approximately of the area and outline configuration of board 12 and carrier plate 14. Chassis 10 also includes a smaller generally rectangular recess 20 within the lower surface thereof, with the two recesses meeting intermediately of the thickness of chassis 10. Carrier plate 14 and board 12 are of the same rectangular outline, and are affixed to chassis 10 with the carrier plate innermost within recess 19, so that both physical protection and support, together with access to essential areas of both top and bottom faces or sides 24 and 25 of board 12 are afforded (carrier plate 14 itself is provided with an aperture 21 congruent with lower chassis recess 20). Plate 14 with the aid of chassis 10 also is a convenient means for providing a ground for those conductors of board 12 that are in electrical contact with plate 14.

The frequency converter itself is otherwise provided complete, electrically speaking, on board 12 (although it will be appreciated that many, if not all, of the elements thereof on one surface of the board could instead be provided upon carrier plate 14). Preferably, however, board 12 carries the main components, as seen particularly from FIG. 3 which shows the lower face 25 of board 12, with a main component generally centrally located thereon being diode quad bridge 28. Electrically, the converter is of the well-known doubly-balanced type employing such diode quads of standard configuration, in which four diodes are wired in series in a flat, square or rectangular pattern to form the bridge. The bridge is mounted flat against board 12, with the rectangular diode pattern thereof in a plane parallel and closely adjacent the board. The above-mentioned Hill reference may be referred to for further details regarding the electrical characteristics and operation of such converters, including their use of baluns, i.e., balancing transformers, to obtain an output signal over a line in which neither side is connected to ground, thus with both sides thereof symmetrical with respect to ground.

In the present construction, it will be seen that the input radio frequency and local oscillator signals are introduced using two orthogonal pairs 29 and 30 of opposed thin, flat, narrow strips of conductive material deposited on each side of the board, and extending orthogonally to each other from the generally central position of bridge 28. Thus, these conductor pairs extend along two paths intersecting at the location of bridge 28. The pairs 29 and 30 of opposed conductors are of a type of microwave waveguide known as "air strip" or "strip line", in contradistinction, for example, to coaxial lines and other types of waveguide or transmission line means. On top surface 24 of board 12, as best seen in FIG. 1, is provided upper conductor 32 of conductor pair 29, and upper conductor 33 of conductor pair 30. Upper conductor 33 is interrupted by a gap at the intersection position above bridge 28, through which gap passes conductor 32. This gap is bridged by one or more wires 34 which do not electrically contact conductor 32, but which render the portions of conductor 33 on either side of the gap electrically continuous. Thus, conductors 32 and 33 on top face 24 are electrically isolated.

Figure 3:
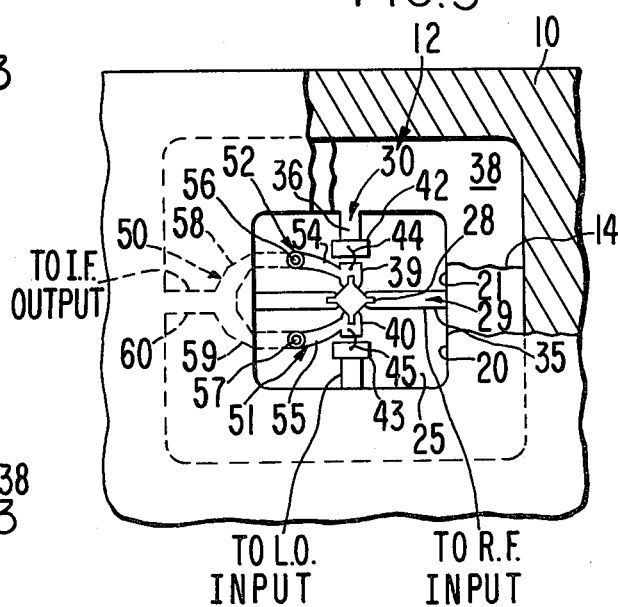
FIG. 3 is a partial plan view of the bottom of the device of FIG. 1, taken in the direction indicated by lines 3—3 of FIG. 2, showing the details of the electrical connections and components on the bottom side of the device, with the Figure partially broken away to show some major constructional elements and structure to better effect.

On the bottom face 24 of the board, as best seen in FIG. 3, is provided lower conductor 35 of conductor pair 29, and lower conductor 36 of conductor pair 30. Lower conductors 35 and 36 define a central gap at the location of bridge 28, each of whose corners are adjacent the respective ends of each of the lower conductors. One pair of the opposite corners of the bridge is electrically connected, as by soldering, to the two adjacent ends of conductor 35, while the other pair of opposite corners of the bridge are electrically connected to the two adjacent ends of conductor 36. It will be noted that all connections to bridge 28 are made essentially flat against board 12, and substantially in the plane of lower board face 25.

As best seen in FIG. 2 particularly, lower face 25 of dielectric board or substrate 12 also is provided with a conductive layer 38 extending completely around the periphery of lower face 25 and electrically continuous with the ends of lower conductors 35 and 36 distal the bridge. In fact, conductors 35 and 36 are desirably inward extensions of this peripheral layer 38. It might be noted that the device would be quite workable without layer 38, in which case conductors 35 and 36 would then merely extend coextensively with their upper face counterparts 32 and 33. However, peripheral layer 38, which is of the same area and form as carrier plate 14, and is coextensive therewith when aligned and assembled together within chassis recess 19, affords together with plate 14 the advantages of an electrically more reliable ground, and enhanced rigidity and support strength for the relative thin and fragile board 12. The present construction also promotes ease of fabrication for the lower conductors of the board, and reliability, electrical integrity, and speed of assembly.

Both the portions of lower conductor 36 extending from opposite corners of bridge 28 are interrupted by gaps just outwardly of the bridge at the ends 39 and 40 proximal the bridge of. Each of a pair of capacitors 42 and 43 is affixed respectively to each of the portions of conductors 36 beyond the gaps, and electrically bridges its associated gap with the aid of wire leads 44 and 45, to ends 39 and 40. The capacitors are chosen to be of a capacitance value so that isolation is provided between the signal to be outputted and the RF or LO input signals.

It will be appreciated that the structure as thus far described defines a pair of input baluns for diode bridge 28, one pair for the RF input signal, and the other for the LO input signal, with the former being defined by opposed conductor pair 29, and the latter by conductor pair 30, with the aid of carrier plate 14 and peripheral layer 38 for grounding at the end of the baluns distal bridge 28, with capacitors 42 and 43 for electrical isolation. At the desired center frequency, the balun lengths are adjusted so as to be one-quarter wavelength long. Leads 47 and 48 connect respectively RF input terminal 15, and LO input terminal 16 with the adjacent baluns.

The output heterodyned IF signal is obtained from bridge 28 by means of output conductor means 50, as best seen in FIGS. 1 and 3, and having a pair of symmetrical branches 51 and 52 extending outwardly from bridge 28. Each begins respectively at proximal ends 39 and 40 of lower conductor 36 (and thereby at one of the corresponding opposite corners of diode 28 connected thereto). Thus, each begins on bottom face 25, and joins and terminates adjacent the edge of the substrate on top face 14. The conductors are, as previously, thin narrow conductive strips, lying flat on the substrate faces, being preferably printed thereon.

Thus, proximal portions 54 and 55 of each branch on bottom face 25 respectively extends to one of a pair of terminals 56 and 57 spaced diagonally from bridge 28, and to either side of lower conductor 35. Terminals 56 and 57 penetrate through board 12 and emerge on top face 24 of the board. Output conductor means 50 then continues outwardly on top face 24, as shown in FIG. 1 and in phantom in FIG. 3, with distal portions 58 and 59 extending respectively from terminals 56 and 57 toward and joining at junction portion 60. Junction portion 60 extends outwardly to the edge of top face 24 of the substrate, in alignment with conductor pair 29, and is joined with the central conductor of IF output terminal 17 by a wire lead 61. It will be understood that each of the coaxial terminals 15, 16 and 17 also includes an outer portion isolated from the central conductor thereof, but electrically in contact with the ground plane of the converter through chassis 10.

The frequency converter configuration of the present invention, although simplified and compact in comparison to prior art converters, has nevertheless been found to perform at a high level electrically. The described example was made for operation in the C-band, 4-8

GHz. It provides broadband frequency conversion and low conversion loss, and in a typical down-converter application, provided a noise figure of less than 8.0 dB, indicating that conversion loss is less than 5 dB when the RF input and IF output are tuned for narrow bands. Conversion loss varies from under 5 to 7 dB over the 4–8 Ghz band. The LO to RF isolation is typically 30 dB. The RF input VSWR is less than 3.0:1 over this band. A third order intermodulation measurement has shown good suppression of undesirable harmonics. The 3 dB IF bandwidth extends 0 to 1500 MHz, and the IF VSWR is less than 3.0:1 over this range. The converter design is useful throughout the microwave range of 1–40 GHz, and readily adaptable to bands other than C-band, by adjusting the lengths of the RF and LO baluns to be one-quarter wavelength for the desired frequency, and selecting an appropriate diode quad.

In the illustrated example, the IF output signal is taken off the LO baluns (since output conductor means 50 is connected to ends 39 and 40 of the structure defining the LO baluns). However, alternatively the IF could also be taken off the RF baluns instead, or the LO and RF inputs could be switched, (with proper consideration given to the need for isolation between the IF output and the RF or LO input signals). The RF and LO inputs (as well as the IF output) are all on the same side of the board, while the ground plane is on the other side of the board; a ground plane is needed only on one side of the board.

Substantially all the required conductors and microwave transmission means are laid out flat along one of the faces of the board and preferably printed thereon. The design allows for physically substantial ground plane elements, especially layer 38, and the use of a substantial carrier plate 14 about the entire lower periphery of the board, without interfering with any of the above advantages. Indeed, the carrier plate surrounds the more delicate diode and capacitor components and connections thereto, enhancing their protection.

As we have seen, the design utilizes a flat diode quad, with all connections thereto made upon one of the faces of the board. Indeed, with automated equipment, the design would allow all these connections to be made simultaneously, and for the diode bridge to be mounted thereby as well. A similar assembly advantage is provided by having the input and output on one side of the board, then enabling, for example, leads 47, 48 and 61, all on the same side of the board, to be attached far more quickly and readily. Finally, the input baluns are of much more simple configuration than with previous designs, affording a flat, compact, and easily fabricated physical structure with a reduced number of elements in a manner not seen previously, and with connections thereto fewer in number and easily made. The entire package, due to its simplicity, reduced number of connections and elements, and flat configuration, is eminently suited to a high degree of automation in manufacture and assembly.

Accordingly, although the present invention has been shown and described with reference to one particular embodiment, it will be appreciated that various modifications and changes are also deemed to be within the contemplation and scope of the invention. The true scope of this invention should be construed only by reference to the following claims.

We claim:

1. In a microwave frequency converter having a diode bridge defining first and second opposite corner pairs, and first and second input baluns connected to said opposite corner pairs of said diode bridge and inputs of said baluns connected to receive a radio frequency input signal, and a local oscillator input signal, the improvement which comprises:
   a dielectric substrate having a first face and a second face, said substrate mounting said bridge on said first face of said substrate;
   a first pair of opposed flat conductors respectively on opposite faces of said substrate;
   a second pair of opposed flat conductors respectively on opposite faces of said substrate;
   each said conductor pair including an electrically continuous conductor on said second face, the conductors on said second face being electrically isolated from each other;
   each conductor on said first face being provide as a pair of collinear spaced portions, each pair of portions oriented mutually orthogonally;
   each said portion extending outwardly from a respective corner of said opposite corner pairs of said diode bridge;
   each said pair of collinear portions being electrically isolated from the other pair;
   a conducting layer on said first face of said substrate positioned outwardly of said bridge and electrically continuous with ones of said conductors on said first face; and
   output conductive path means extending outwardly from said bridge along said substrate, and beginning on said first faces passing through said substrate inwardly of said conducting layer and continuing on the second face of said substrate, for supplying therefrom a heterodyned output signal.

2. The converter of claim 1, in which said conducting layer is grounded to comprise, with the conductors of each face pair on said second side of said substrate, said first and second pairs of input baluns.

3. The converter of claim 1, which said output conductive path means includes a pair of output conductors, each extending respectively from a respective corner of one of said opposite corner pairs of said bridge, each respectively passing through said substrate at points between said conducting layer and said bridge, and continuing over said second face to join to form a junction, said output signal being supplied therefrom.

4. The converter of claim 1, in which the improvement further includes a carrier plate attached to said substrate generally overlaying said conductive layer, said plate being in good electrical contact with said layer.

5. The converter of claim 1, in which the improvement further includes a pair of capacitors, each between a respective corner of one of said opposite corner pair of said bridge, and an adjacent end of one of said conductor portion pairs on said first face, to provide isolation between said output signal and said input signals.

6. The converter of claim 1, in which said dielectric substrate is generally flat, said conductors, output conducting path means, and conducting layer all comprise thin films deposited flat upon said substrate, and said diode bridge comprises a plurality of diodes arranged in a plane closely adjacent and parallel to said substrate, whereby a relatively thin, compact, and flat configuration is provided.

7. The converter of claim 1, in which the length of said first and second input baluns are one-quarter the wavelength of said radio frequency and local oscillator input signals, respectively.

8. Compact, simplified assembly for microwave frequency converter, comprising:
- a generally flat dielectric substrate having first and second faces;
- a diode bridge defining first and second opposite corner pairs and mounted on said first face;
- a first pair of flat conductors on said first face, each extending in a first path outwardly from a respective corner of said first opposite corner pair of said bridge;
- a second pair of flat conductors on said first face, each and extending in a second path outwardly from a respective corner of said second opposite corner of said bridge;
- a third flat conductor on said second face extending along said first path, so as to be opposed to said first pair of conductors on said first face;
- a fourth generally flat conductor on said second face extending along said second path so as to be opposed to said second pair of conductors on said first face;
- said third and fourth conductors on said second face being in electrical isolation from each other;
- and a pair of fifth flat conductors on one of said faces electrically isolated from conductors extending along said first and second paths each of said fifth conductors extending from a respective corner of one of said bridge opposite corner pairs along said one face to a respective location spaced from said bridge, each of said fifth conductors passing through at a corresponding one of said locations and extending over the other of said faces to join in a junction, wherefrom a heterodyned output signal is obtained when a radio frequency signal and a local oscillator signal are supplied to the conductors, respectively, at ends of said first and second paths distal said bridge.

9. An assembly as in claim 8, which further includes a conductive layer in contact with said first face of said substrate outwardly of said bridge and said locations, said conductive layer being electrically continuous with said first and second pairs of conductors of said first face.

10. An assembly as in claim 8, in which said conductive layer and first and second pairs of conductors of said first face are grounded.

11. An assembly as in claim 10, which further includes a carrier plate in electrical contact with at least said conductive layer, and through which said grounding is effected, said plate having an aperture enclosing said bridge and the portion of said pair of fifth conductors on said second face.

12. An assembly as in claim 8, in which said fourth conductor on said second face are interrupted by a first gap, with the third conductor on said second face passing through said gap, said gap being bridged by an auxiliary conductor passing over said remaining conductor but not in contact therewith.

13. An assembly as in claim 8, which further includes a pair of capacitors respectively connected between one of said opposite corner pair of said bridge and an adjacent end of each conductor of one of the conductor pairs on said first face, whereby said signals are isolated from said output signals.

14. An assembly as in claim 13, in which said conductors are narrow, and of thickness no greater than that of said substrate, and said diode bridge and said capacitors are affixed flat against said substrate, whereby a thin, compact assembly is provided.

15. An assembly as in claim 8, in which said first and second paths are orthogonal to each other.

16. An assembly as in claim 8, which further includes a pair of conductive terminals extending through said substrate respectively at said pair of locations, said terminals being spaced diagonally from said bridge on opposite sides of one of said first and second paths, and in which each of said fifth conductors includes a first portion extending along said first face from a respective one of said opposite corners of said bridge to said terminals.

17. An assembly as in claim 16, in which each of said fifth conductors includes a second portion extending along said second face from a corresponding one of said terminals to said junction adjacent the periphery of said substrate.

* * * * *